US007900853B2

(12) United States Patent
Kim et al.

(10) Patent No.: US 7,900,853 B2
(45) Date of Patent: Mar. 8, 2011

(54) APPARATUS FOR SUPPLYING CHEMICAL LIQUID

(75) Inventors: Si-Eun Kim, Chungbuk (KR); Kyo-Woog Koo, Chungcheongnam-do (KR); Keun-Young Park, Chungcheongnam-do (KR)

(73) Assignee: Semes Co., Ltd. (KR)

( * ) Notice: Subject to any disclaimer, the term of this patent is extended or adjusted under 35 U.S.C. 154(b) by 138 days.

(21) Appl. No.: 12/248,085

(22) Filed: Oct. 9, 2008

(65) Prior Publication Data

US 2009/0120468 A1 May 14, 2009

(30) Foreign Application Priority Data

Oct. 11, 2007 (KR) ..................... 10-2007-0102692

(51) Int. Cl.
*B05B 1/28* (2006.01)

(52) U.S. Cl. ....................... 239/288; 239/103; 239/104; 239/120; 239/124; 239/505; 239/566; 239/750; 239/752

(58) Field of Classification Search ................. 239/103, 239/104, 120, 121, 288–288.5, 505, 507, 239/548, 566, 750–752, DIG. 13, 124; 134/104.2, 134/172, 198, 902; 118/305, 315, 326
See application file for complete search history.

(56) References Cited

U.S. PATENT DOCUMENTS 5,299,533 A * 4/1994 Johnston et al. ............. 239/752
5,348,234 A * 9/1994 v.d. Woude ................. 239/753
5,353,996 A * 10/1994 Gallacher et al. ........... 239/750

FOREIGN PATENT DOCUMENTS

| | | | |
|---|---|---|---|
| CN | 1236977 | A | 12/1999 |
| EP | 0 959 490 | A2 | 5/1999 |
| JP | 3-263831 | A | 11/1991 |
| JP | 2003209087 | A | 7/2003 |
| JP | 2007-157898 | A | 6/2007 |
| JP | 2007-165746 | A | 6/2007 |

OTHER PUBLICATIONS

Korean Office Action for Korean Patent Application No. 10-2007-0102692 issued Nov. 12, 2008.
Office Action issued Dec. 11, 2009 by the Chinese Patent Office for corresponding Chinese patent application No. 200810167467.X.
Office Action issued Sep. 15, 2010 by the Japanese Patent Office for corresponding Japanese patent application No. 2008-263656.

* cited by examiner

*Primary Examiner*—Steven J Ganey
(74) *Attorney, Agent, or Firm*—Myers Bigel Sibley & Sajovec, P.A.

(57) ABSTRACT

Provided is an apparatus for supplying chemical liquid. The apparatus includes: a plurality of nozzles, each of which can be moved forward or backward and supplies chemical liquid; a nozzle cover which accommodates the nozzles therein and has an open end to allow each of the nozzles to move into or out of the nozzle cover; and a nozzle driver which moves each of the nozzles forward or backward.

11 Claims, 9 Drawing Sheets

APPARATUS FOR SUPPLYING CHEMICAL LIQUID

This application claims priority from Korean Patent Application No. 10-2007-0102692 filed on Oct. 11, 2007 in the Korean Intellectual Property Office, the disclosure of which is incorporated herein by reference in its entirety.

BACKGROUND OF THE INVENTION

1. Field of the Invention

The present invention relates to an apparatus for supplying chemical liquid, and more particularly, to an apparatus for supplying chemical liquid, the apparatus capable of simultaneously supplying a plurality of chemical liquids by using a plurality of nozzles that can be independently driven forward or backward and capable of enhancing processing efficiency by reducing the waiting time required to change the nozzles.

2. Description of the Related Art

Recently, semiconductor device fabrication technology is being developed to produce more highly integrated and more reliable semiconductor devices with reduced response time in order to satisfy various needs of consumers.

A conventional semiconductor device is fabricated by depositing a predetermined layer on a silicon semiconductor substrate, which is used as a semiconductor substrate, and transforming the layer into patterns having electrical properties. Here, the patterns are formed through sequential or repeated unit processes such as a layer deposition process, a photolithography process, an etching process, an ion implantation process, and a polishing process.

After each unit process is performed on the semiconductor substrate, foreign matter, such as reaction byproducts and particles that are generated during the unit process, remain on the semiconductor substrate. If the foreign matter is not removed, it becomes a source of serous errors in subsequent processes.

In particular, when a semiconductor element having a fine structure is fabricated, particles, which remain attached to a wafer after each unit process, as well as foreign matter, static electricity, watermarks, and line particles must be removed. Otherwise, they greatly affect subsequent processes. For this reason, before and after each unit process, a surface of the wafer is cleaned by using chemical liquids or distilled water.

A single-wafer-type cleaning device, which is a kind of cleaning device, cleans a substrate by rotating the substrate attached to a spin chuck while an apparatus for supplying chemical liquid, which is disposed above the substrate, supplies a cleaning solution to the substrate.

FIG. 1 is a perspective view of a conventional apparatus for supplying chemical liquid by using a chuck cylinder 20. Referring to FIG. 1, the conventional apparatus attaches one of a plurality of nozzles 10*a* through 10*c*, which supplies predetermined chemical liquid, to the chuck cylinder 20 for a cleaning process. The chuck cylinder 20, which is moved by a vertical transfer actuator 30 and a horizontal transfer actuator 40, moves the nozzle 10*a*, 10*b* or 10*c* attached thereto to a position above a substrate (not shown). Then, the nozzle 10*a*, 10*b* or 10*c* supplies the predetermined chemical liquid onto the substrate.

In the conventional apparatus, after the substrate is supplied with the predetermined chemical liquid through one of the nozzles 10*a* through 10*c*, if another chemical liquid needs to be supplied onto the substrate, the chuck cylinder 20 is moved back to where the nozzles 10*a* through 10*c* are disposed. Then, one of the nozzles 10*a* through 10*c*, which is attached to the chuck cylinder 20, is detached from the chuck cylinder 20, and another one of the nozzles 10*a* through 10*c* is attached to the chuck cylinder 20. Thereafter, the chuck cylinder 20 having the nozzle 10*a*, 10*b* or 10*c* newly attached thereto is moved to the substrate, so that the nozzle 10*a*, 10*b* or 10*c* can supply the chemical liquid onto the substrate.

Therefore, when a plurality of chemical liquids need to be used successively, processing efficiency can be reduced due to the waiting time required to change the nozzles 10*a* through 10*c*. In addition, since only one of the nozzles 10*a* through 10*c* can be attached to the chuck cylinder 20, it is impossible to simultaneously supply a plurality of chemical liquids to the substrate.

SUMMARY OF THE INVENTION

Aspects of the present invention provide an apparatus for supplying chemical liquid, the apparatus capable of simultaneously supplying a plurality of chemical liquids by using a plurality of nozzles that can be independently driven and capable of enhancing processing efficiency by reducing the waiting time required to change the nozzles when the chemical liquids need to be successively used.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an apparatus for supplying chemical liquid. The apparatus includes: a plurality of nozzles, each of which can be moved forward or backward and supplies chemical liquid; a nozzle cover which accommodates the nozzles therein and has an open end to allow each of the nozzles to move into or out of the nozzle cover; and a nozzle driver which moves each of the nozzles forward or backward.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
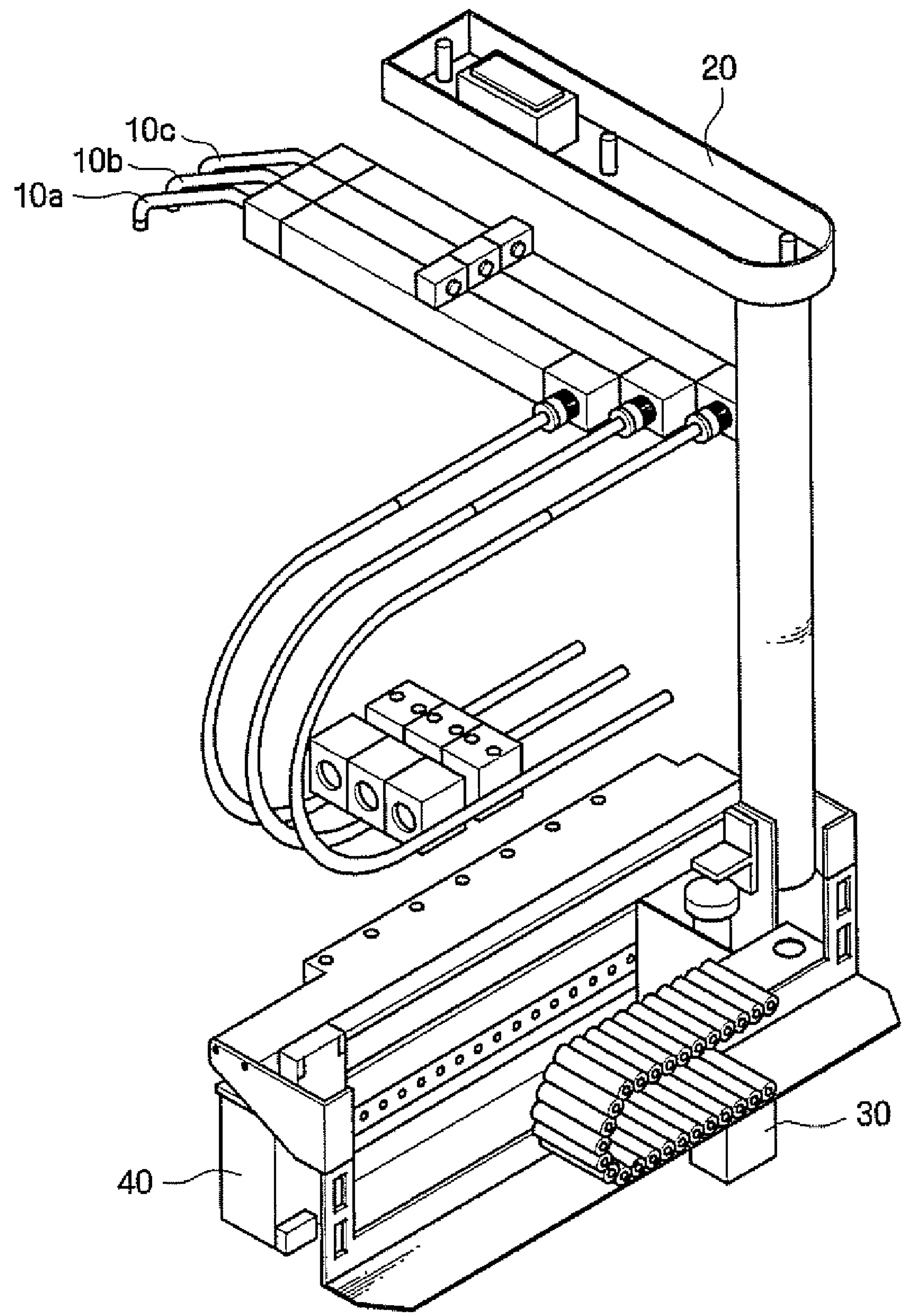
FIG. 1 is a perspective view of a conventional apparatus for supplying chemical liquid by using a chuck cylinder.

Advantages and features of the present invention and methods of accomplishing the same may be understood more readily by reference to the following detailed description of exemplary embodiments and the accompanying drawings. The present invention may, however, be embodied in many different terms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Hereinafter, an apparatus for supplying chemical liquid according to exemplary embodiments of the present invention will be described with reference to the attached drawings.

Figure 2:
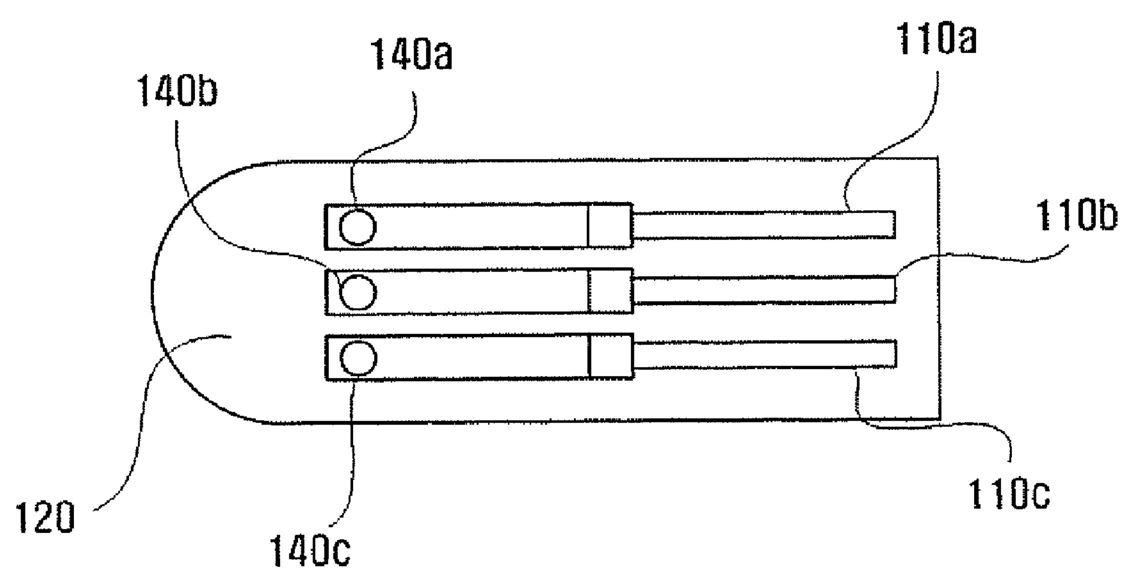
FIG. 2 is a plan view of an apparatus for supplying chemical liquid according to an exemplary embodiment of the present invention.
Figure 3:
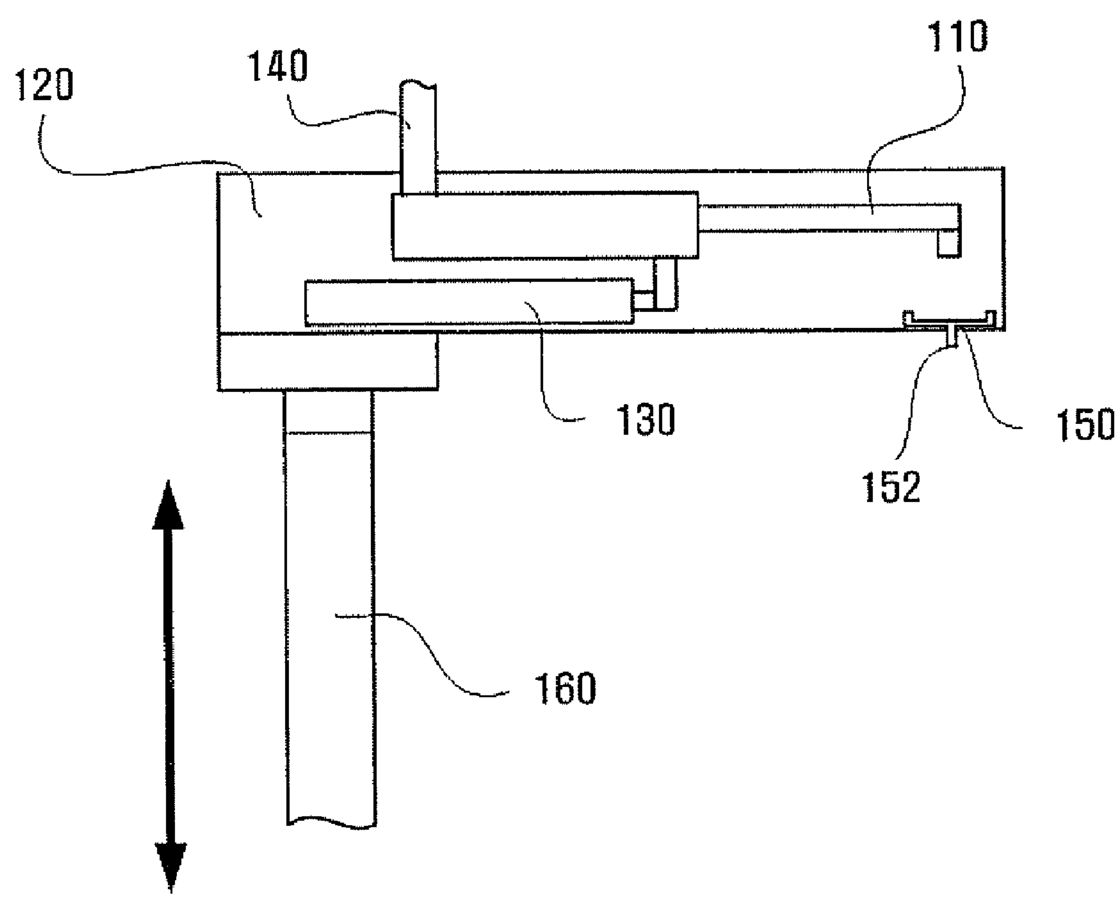
FIG. 3 is a side view of the apparatus shown in FIG. 2.

FIG. 2 is a plan view of an apparatus for supplying chemical liquid according to an exemplary embodiment of the present invention. FIG. 3 is a side view of the apparatus shown in FIG. 2.

Referring to FIGS. 2 and 3, the apparatus according to the present embodiment includes nozzles 110, a nozzle cover 120, and a nozzle driver 130. The apparatus may further include a horizontal nozzle cover driver (not shown), a vertical nozzle cover driver (not shown), and a chemical liquid ejector 150.

Each of the first through third nozzles 110*a* through 110*c* supplies chemical liquid onto a substrate 200. In addition, each of the first through third nozzles 110*a* through 110*c* can be independently moved forward or backward by the nozzle driver 130. The first through third nozzles 110*a* through 110*c* include chemical liquid suppliers 140*a* through 140*c*, respectively, and different chemical liquids are supplied to the first through third nozzles 110*a* through 110*c* through hoses or pipes, respectively. In the drawings, the three nozzles 110*a* through 110*c* are shown, which is, however, a mere example. That is, more than three nozzles can be provided.

The nozzle cover 120 accommodates the first through third nozzles 110*a* through 110*c* therein and has an open side to allow each of the first through third nozzles 110*a* through 110*c* to move forward out of the nozzle cover 120 and supply chemical liquid onto the substrate 200. The nozzle cover 120 having the first through third nozzles 110*a* through 110*c* therein may be moved to the right or left by the horizontal nozzle cover driver (not shown). In addition, the nozzle cover 120 having the first through third nozzles 110*a* through 110*c* therein may be moved upward or downward by the vertical nozzle cover driver (not shown).

The nozzle driver 130 moves each of the first through third nozzles 110*a* through 110*c* within the nozzle cover 120 forward or backward. The nozzle driver 130 may be an air cylinder that can move each of the first through third nozzles 110*a* through 110*c* connected thereto. However, the nozzle driver 130 according to the present invention is not limited to the air cylinder. That is, the nozzle driver 130 can be any device that can move each of the first through third nozzles 110*a* through 110*c* forward or backward. In the drawings, the nozzle driver 130 is disposed inside the nozzle cover 120. However, the nozzle driver 130 may also be disposed outside the nozzle cover 120.

The chemical liquid ejector 150 collects chemical liquids that drop from the first through third nozzles 110*a* through 110*c* and ejects the collected chemical liquids from the nozzle cover 120. As shown in FIG. 3, the chemical liquid ejector 150 is disposed under respective ends of the first through third nozzles 110*a* through 110*c* within the nozzle cover 120 to collect chemical liquids which drop from the respective ends of the first through third nozzles 110*a* through 110*c*. The chemical liquid ejector 150 collects residual chemical liquids that drop from the respective ends of the nozzles 110*a* through 110*c* to prevent the residual chemical liquids from contaminating the nozzle cover 120 or the substrate 200.

In addition, as shown in the drawing, the chemical liquid ejector 150 includes a pipe 152 to eject the collected chemical liquids from the nozzle cover 120 through the pipe 152. The single chemical liquid ejector 150 may be disposed within the nozzle cover 120 to collect chemical liquids that drop from the first through third nozzles 110*a* through 110*c*. Alternatively, a plurality of chemical liquid ejectors corresponding to the first through third nozzles 110*a* through 110*c*, respectively, may be disposed within the nozzle cover 120. In this case, the chemical liquid ejectors may be disposed under the first through third nozzles 110*a* through 110*c* respectively and collect chemical liquids that drop from the first through third nozzles 110*a* through 110*c* respectively and separately.

Figure 6:
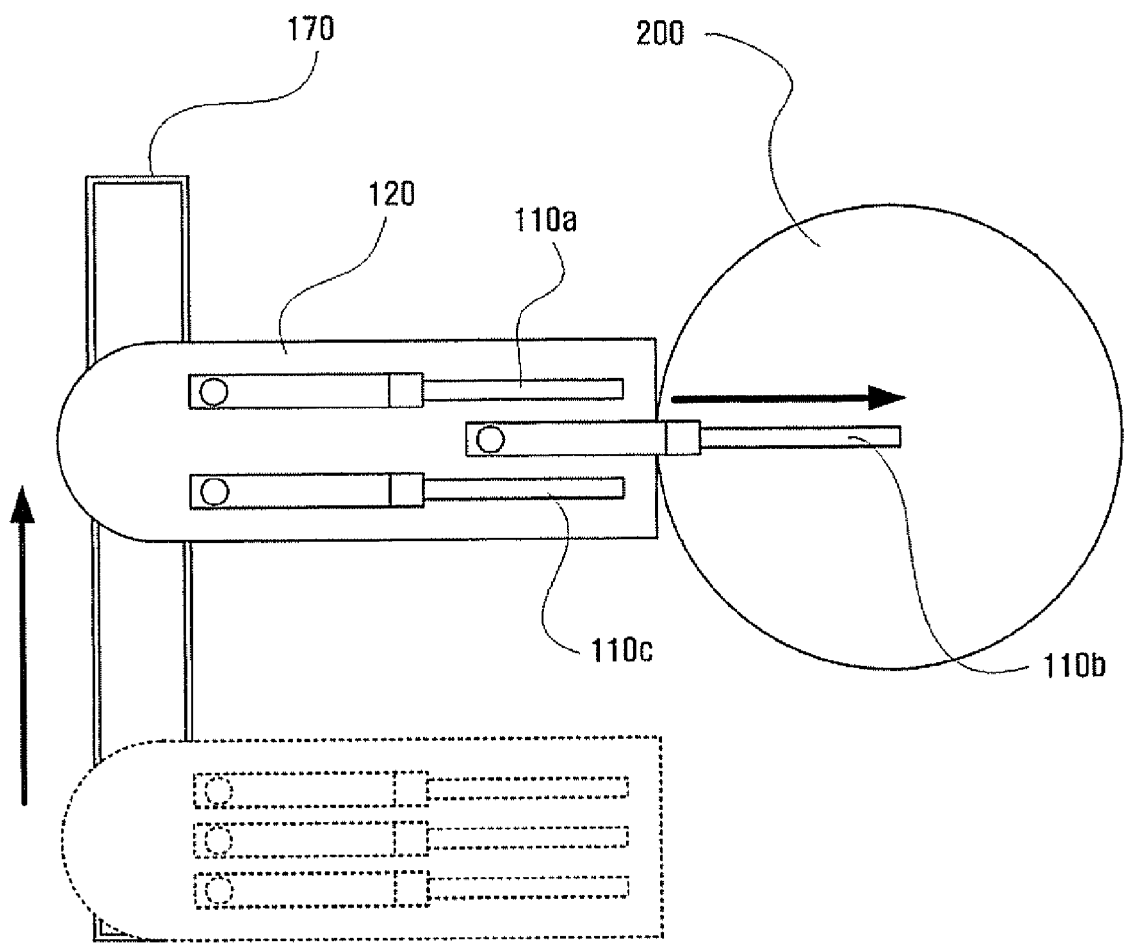
FIG. 6 is a plan view of the apparatus of FIG. 2 in which a nozzle cover can be moved to the right or left.

The horizontal nozzle cover driver (not shown) moves the nozzle cover 120 to the right or left as shown in FIG. 6. The horizontal nozzle cover driver (not shown) may include a guide 170 which guides the nozzle cover 120 and a motor (not shown) which generates power to move the nozzle cover 120 along the guide 170. The horizontal nozzle cover driver (not shown) may come in various configurations as long as it can move the nozzle cover 120 to the right or left. The horizontal nozzle cover driver (not shown) places each of the first through third nozzles 110*a* through 110*c* within the nozzle cover 120 right in the middle of or at a predetermined position above the substrate 200, so that each of the first through third nozzles 110*a* through 110*c* can spray chemical liquid in the middle of or at the predetermined position above the substrate 200.

The vertical nozzle cover driver (not shown) moves the nozzle cover 120 upward or downward. To move the nozzle cover 120 upward or downward, the vertical nozzle cover driver (not shown) may include a shaft 160 which is connected to the nozzle cover 120 and a power generator such as an air cylinder (not shown) which moves the shaft 160 upward or downward. The vertical nozzle cover driver (not shown) may adjust the distance between each of the first through third nozzles 110*a* through 110*c* and the substrate 200, so that each of the first through third nozzles 110*a* through 110*c* can spray chemical liquid onto the substrate 200 at an optimal distance from the substrate 200.

The operation of the apparatus according to the present embodiment will now be described with reference to the attached drawings.

Figure 4:
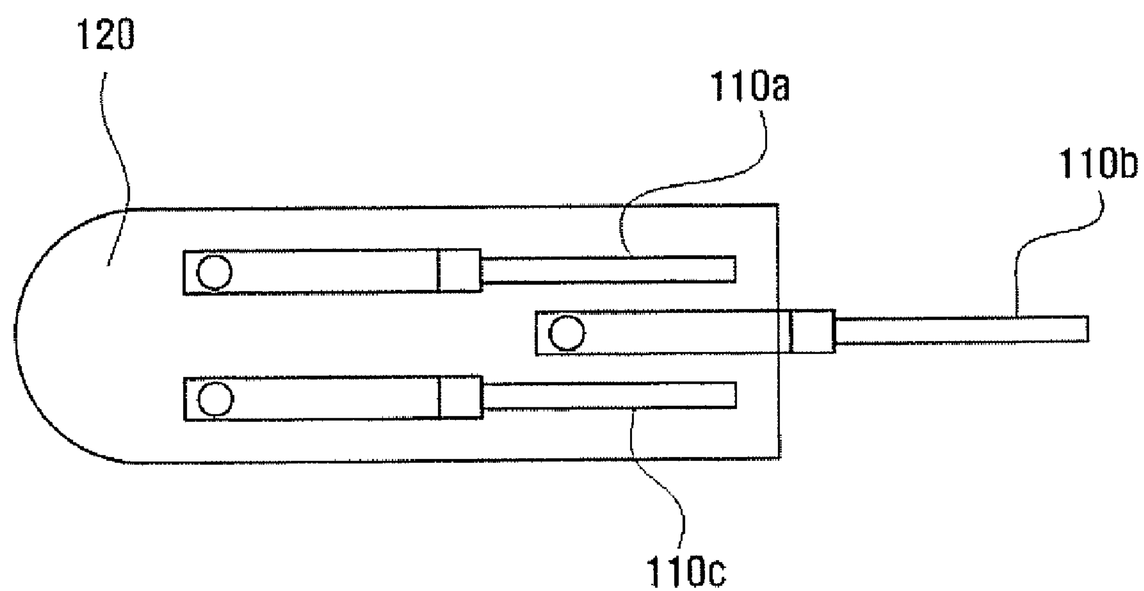
FIG. 4 is a plan view for explaining the operation of the apparatus shown in FIG. 2.
Figure 5:
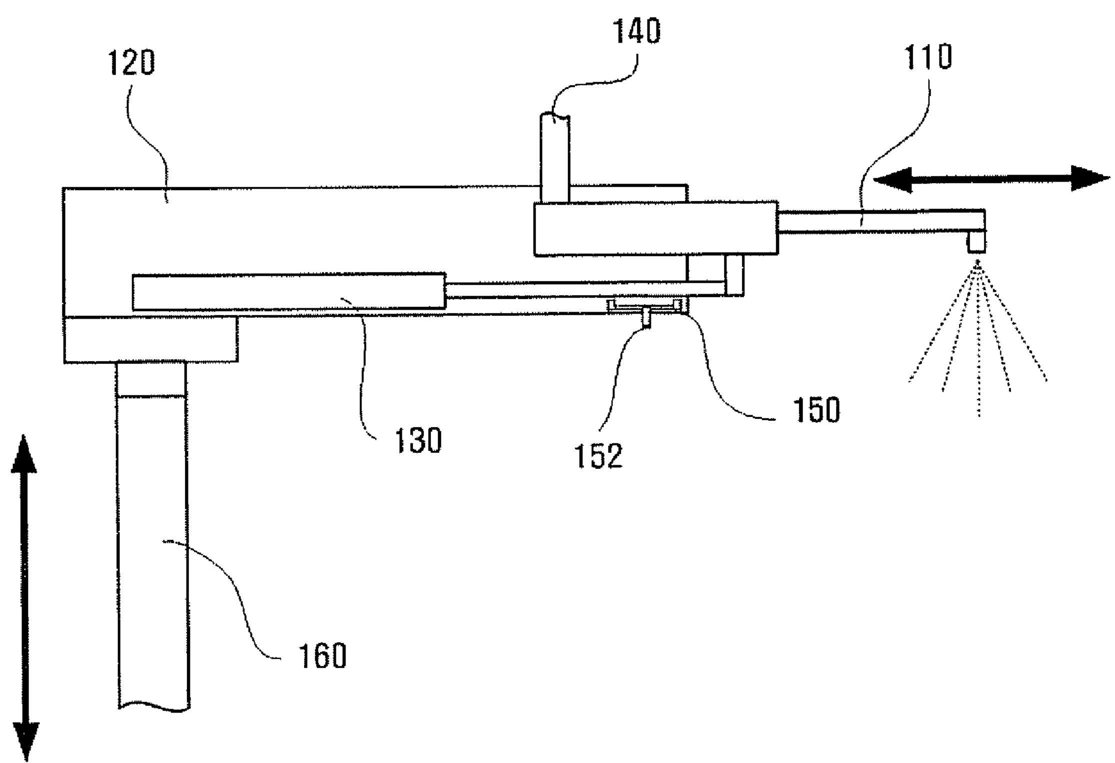
FIG. 5 is a side view for explaining the operation of the apparatus shown in FIG. 2.
Figure 7:
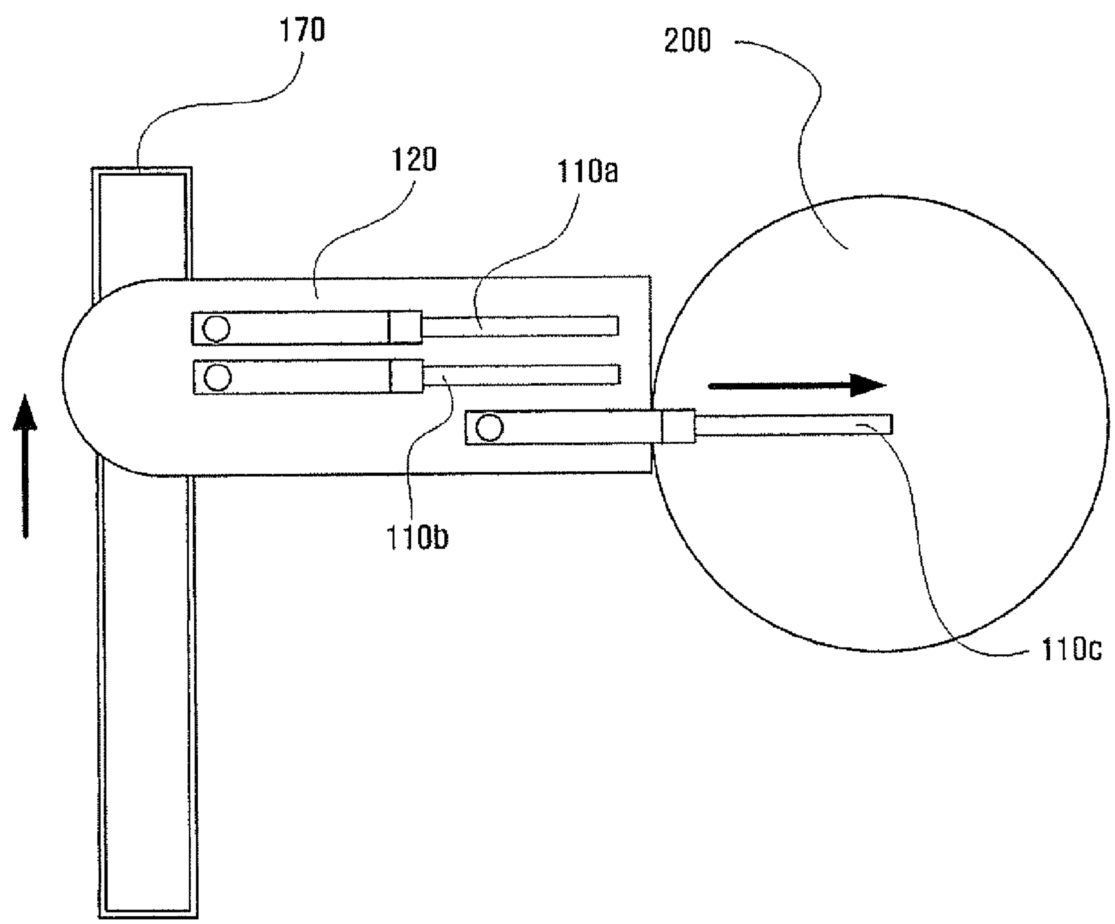
FIG. 7 is a plan view of the apparatus of FIG. 2 which sprays chemical liquid onto a substrate by using a third nozzle.

FIG. 4 is a plan view for explaining the operation of the apparatus shown in FIG. 2. FIG. 5 is a side view for explaining the operation of the apparatus shown in FIG. 2. FIG. 6 is a plan view of the apparatus of FIG. 2 in which the nozzle cover 120 can be moved to the right or left. FIG. 7 is a plan view of the apparatus of FIG. 2 which sprays chemical liquid onto the substrate 200 by using the third nozzle 110*c*.

Referring to FIG. 6, the nozzle cover 120 is moved to the right or left by the horizontal nozzle cover driver (not shown). The horizontal nozzle cover driver (not shown) may move the nozzle cover 120 from a position shown in dotted lines to the position of the substrate 200.

Referring to FIG. 4, the second nozzle 110*b* sprays chemical liquid onto the substrate 200 after being moved forward by the nozzle driver 130. When another chemical liquid needs to be supplied onto the substrate 200 successively after the chemical liquid is supplied by the second nozzle 110*b*, the second nozzle 110*b* is moved back into the nozzle cover 120, and the first nozzle 110*a* or the third nozzle 110*c* is moved forward to supply another chemical liquid onto the substrate 200.

Referring to FIG. 7, chemical liquid is sprayed from the third nozzle 110*c* onto the substrate 200. Specifically, after the second nozzle 110*b* sprays chemical liquid onto the substrate 200 as shown in FIG. 6, it is moved back into the nozzle cover 120, and the third nozzle 110*c* is moved forward as shown in FIG. 7. Here, the horizontal nozzle cover driver (not shown) slightly moves the nozzle cover 120 to place the third nozzle 110*c* in the middle of the substrate 200.

As described above with reference to FIG. 1, in the conventional apparatus for supplying chemical liquid, when chemical liquids need to be successively supplied onto the substrate (not shown), the chuck cylinder 20 is moved to where the nozzles 10*a* through 10*c* are disposed. Then one of the nozzles 10*a* through 10*c*, which is already attached to the chuck cylinder 20, is detached from the chuck cylinder 20, and another one of the nozzles 10*a* through 10*c* is newly attached to the chuck cylinder 20. Next, the chuck cylinder 20 having the nozzle 10*a*, 10*b* or 10*c* newly attached thereto is moved to the substrate (not shown). Thus, the entire processing efficiency is reduced due to the waiting time required to change the nozzles 10*a* through 10*c*.

However, in the present invention, when chemical liquids need to be successively supplied onto the substrate 200, each of the first through third nozzles 110*a* through 110*c*, which can be moved forward or backward, is moved into or out of the nozzle cover 120. In addition, the nozzle cover 120 is moved by a distance corresponding to a gap between the first through third nozzles 110*a* through 110*c*, so that a corresponding one of the first through third nozzles 110*a* through 110*c* faces the center of the substrate 200.

Thus, the waiting time required to change the first through third nozzles 110*a* through 110*c* to supply different liquids is very short.

Furthermore, since the vertical nozzle cover driver (not shown) can move the nozzle cover 120 upward or downward, each of the first through third nozzles 110*a* through 110*c* can spray chemical liquid onto the substrate 200 at an optimal distance from the substrate 200.

The apparatus according to the present embodiment can also simultaneously supply chemical liquids onto the substrate 200 through the first through third nozzles 110*a* through 110*c*.

Figure 8:
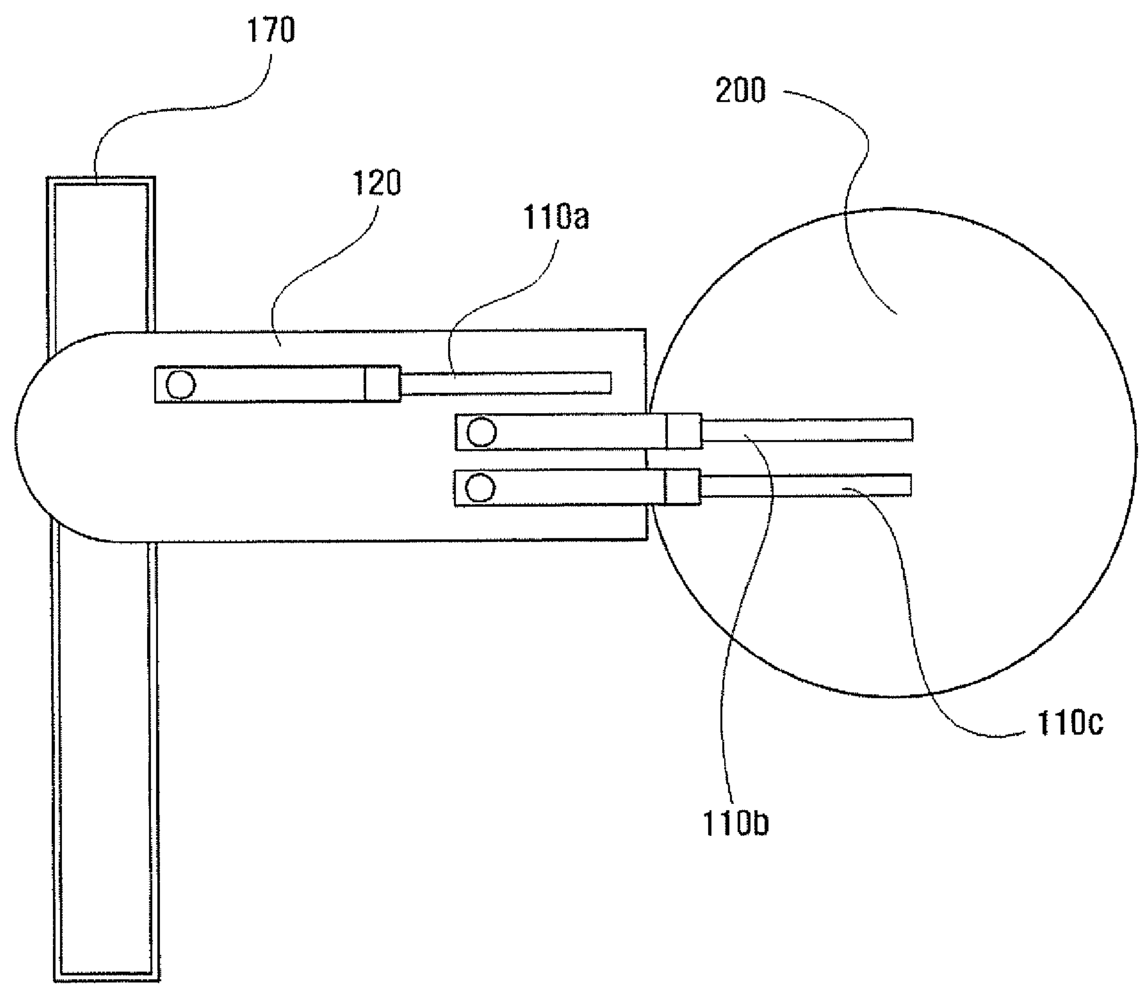
FIG. 8 is a plan view of the apparatus of FIG. 2 which sprays chemical liquids onto the substrate by using a plurality of nozzles.

FIG. 8 is a plan view of the apparatus of FIG. 2 which sprays chemical liquids onto the substrate 200 by using the first through third nozzles 110*a* through 110*c*.

Referring to FIG. 8, after the nozzle driver 130 simultaneously moves the second and third nozzles 110*b* and 110*c* to an area in front of the nozzle cover 120, the second and third nozzles 110*b* and 110*c* simultaneously spray different chemical liquids.

Hereinafter, an apparatus for supplying chemical liquid according to another exemplary embodiment of the present invention will be described. Like the apparatus for supplying chemical liquid according to the previous embodiment, the apparatus for supplying chemical liquid according to the present embodiment includes first through third nozzles 110*a* through 110*c*, a nozzle cover 120, a nozzle driver 130, and a chemical liquid ejector 150. Thus, a description of the above elements will be omitted and differences between the present and previous embodiments will mainly be described.

Figure 9:
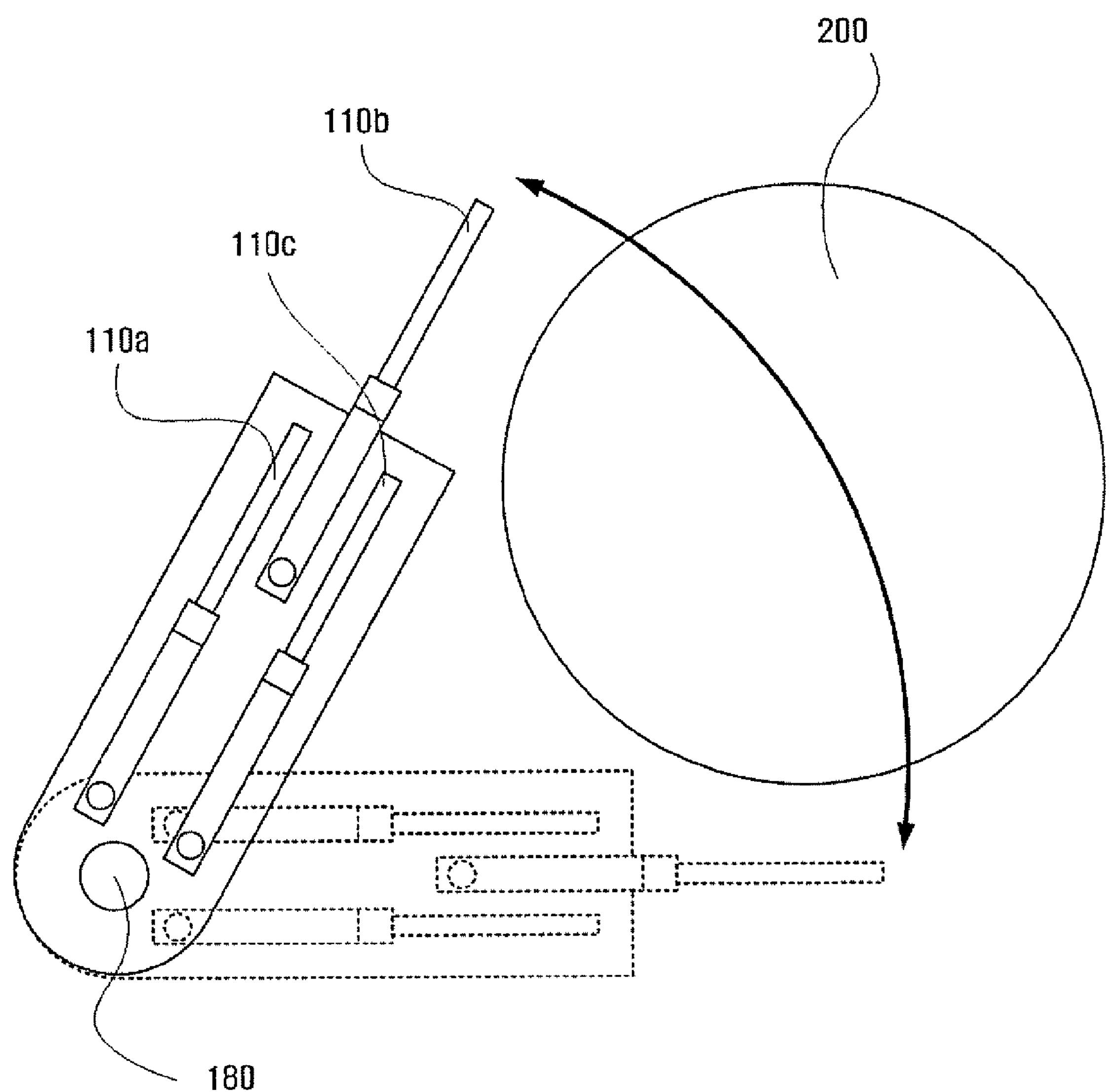
FIG. 9 is a plan view of an apparatus for supplying chemical liquid according to another exemplary embodiment of the present invention, the apparatus spraying chemical liquids onto a substrate by rotating a nozzle cover.

FIG. 9 is a plan view of the apparatus for supplying chemical liquid according to another exemplary embodiment of the present invention, the apparatus spraying chemical liquid onto a substrate 200 by rotating the nozzle cover 120.

In the previous embodiment described above, the horizontal nozzle cover driver (not shown) moves the nozzle cover 120 to the right or left. However, in the present embodiment shown in FIG. 9, a nozzle cover rotator (not shown) rotates the nozzle cover 120.

The nozzle cover rotator (not shown) rotates the nozzle cover 120 about an end of the nozzle cover 120 which is opposite an open end of the nozzle cover 120. The nozzle cover rotator (not shown) may include a shaft 180 which is connected to the nozzle cover 120 and a motor (not shown) which generates power to rotate the shaft 180. However, the present invention is not limited thereto. The nozzle cover rotator may come in various configurations as long as it can rotate the nozzle cover 120 about an end of the nozzle cover 120.

When different chemical liquids need to be successively supplied onto the substrate 200 as in the previous embodiment, each of the first through third nozzles 110*a* through 110*c* may be moved forward or backward by the nozzle driver 130 to supply chemical liquid. As in the previous embodiment, different chemical liquids can also be simultaneously sprayed onto the substrate 200 in the present embodiment. In the present embodiment, the nozzle cover rotator (not shown) rotates the nozzle cover 120 in a clockwise direction or a counterclockwise direction. Thus, the entire area of the substrate 200 can be scanned and thus sprayed with chemical liquids. Furthermore, since the vertical nozzle cover driver (not shown) can adjust the distance between each of the first through third nozzles 110*a* through 110*c* and the substrate 200, each of the first through third nozzles 110*a* through 110*c* can spray chemical liquid at an optimal distance from the substrate 200.

An apparatus for supplying chemical liquid according to the present invention provides at least one of the following advantages.

First, when a plurality of chemical liquids are successively supplied by using a plurality of nozzles that are driven independently, the waiting time required to change the nozzles can be reduced, thereby enhancing processing efficiency.

Second, a plurality of chemical liquids can be supplied simultaneously.

Third, residual chemical liquids that drop from the nozzles inside a nozzle cover are ejected from the nozzle cover. Thus, the contamination of a substrate or the nozzle cover due to the residual chemical liquids can be prevented.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. An apparatus for supplying chemical liquid, the apparatus comprising:

- a plurality of nozzles, each of which can be moved forward or backward and supplies chemical liquid;
- a nozzle cover which accommodates the nozzles therein and has an open end to allow each of the nozzles to move into or out of the nozzle cover;
- a nozzle driver which moves each of the nozzles forward or backward; and a horizontal nozzle cover driver which moves the nozzle cover having the nozzles therein to the right or left.

2. The apparatus of claim 1, further comprising a vertical nozzle cover driver which moves the nozzle cover having the nozzles therein upward or downward.

3. The apparatus of claim 1, further comprising a nozzle cover rotator which rotates the nozzle cover having the nozzles therein about an end of the nozzle cover which is opposite the open end thereof.

4. The apparatus of claim 3, further comprising a vertical nozzle cover driver which moves the nozzle cover having the nozzles therein upward or downward.

5. The apparatus of claim 1, wherein the nozzle driver moves each of the nozzles forward or backward by using an air cylinder.

6. The apparatus of claim 1, further comprising a chemical liquid ejector which collects chemical liquids that drop from the nozzles and ejects the collected chemical liquids from the nozzle cover.

7. The apparatus of claim 6, wherein the chemical liquid ejector is formed for each of the nozzles.

8. An apparatus for supplying chemical liquid, the apparatus comprising:

a plurality of nozzles, each of which can be moved forward or backward and supplies chemical liquid;

a nozzle cover which accommodates the nozzles therein and has an open end to allow each of the nozzles to move into or out of the nozzle cover;

a nozzle driver which moves each of the nozzles forward or backward; and a nozzle cover rotator which rotates the nozzle cover having the nozzles therein about an end of the nozzle cover which is opposite the open end thereof.

9. The apparatus of claim 8, further comprising a vertical nozzle cover driver which moves the nozzle cover having the nozzles therein upward or downward.

10. An apparatus for supplying chemical liquid, the apparatus comprising:

a plurality of nozzles, each of which can be moved forward or backward and supplies chemical liquid;

a nozzle cover which accommodates the nozzles therein and has an open end to allow each of the nozzles to move into or out of the nozzle cover;

a nozzle driver which moves each of the nozzles forward or backward; and a chemical liquid ejector which collects chemical liquids that drop from the nozzles and ejects the collected chemical liquids from the nozzle cover.

11. The apparatus of claim 10, wherein the chemical liquid ejector is formed for each of the nozzles.

* * * * *